United States Patent [19]

Hendriks et al.

[11] 4,414,688

[45] Nov. 8, 1983

[54] RF-INPUT STAGE

[75] Inventors: Johannes H. Hendriks; Johannes J. M. Van Daal, both of Eindhoven, Netherlands

[73] Assignee: U.S. Philips Corporation, New York, N.Y.

[21] Appl. No.: 309,311

[22] Filed: Oct. 7, 1981

[30] Foreign Application Priority Data

Nov. 6, 1980 [NL] Netherlands ............... 8006059

[51] Int. Cl.³ .......................................... H04B 1/16
[52] U.S. Cl. .................................. 455/188; 330/277; 358/188; 455/286; 455/290; 455/293; 455/311
[58] Field of Search ............... 455/188, 286, 289, 290, 455/292, 293, 307, 311, 341; 330/277, 302, 306; 333/32; 358/188

[56] References Cited

U.S. PATENT DOCUMENTS 3,482,167 12/1969 Kaplan et al. .................. 455/242
4,048,598 9/1977 Knight ............................ 455/188

Primary Examiner—Marc E. Bookbinder
Attorney, Agent, or Firm—Edward W. Goodman

[57] ABSTRACT

RF-input stage for TV receivers comprising a field effect transistor in grounded source circuit configuration and a frequency-dependent coupling network arranged between the gate electrode of the field effect transistor and an aerial input for selecting TV signals and transforming the signal impedance. The frequency-dependent coupling network is terminated with a resistor which is arranged between the gate electrode of the field effect transistor and ground and whose value has been chosen so that on the one hand this resistor terminates in conjunction with the input impedance of the field effect transistor the frequency-dependent coupling network with an acceptable reflection factor and on the other hand forms in conjunction with the output impedance of the frequency-dependent coupling network an impedance at which the noise contribution of the field effect transistor is at least substantially at its lowest. This results in a small impedance transformation of the frequency-dependent coupling network and makes it possible to construct this coupling network in a wide-band mode.

8 Claims, 1 Drawing Figure

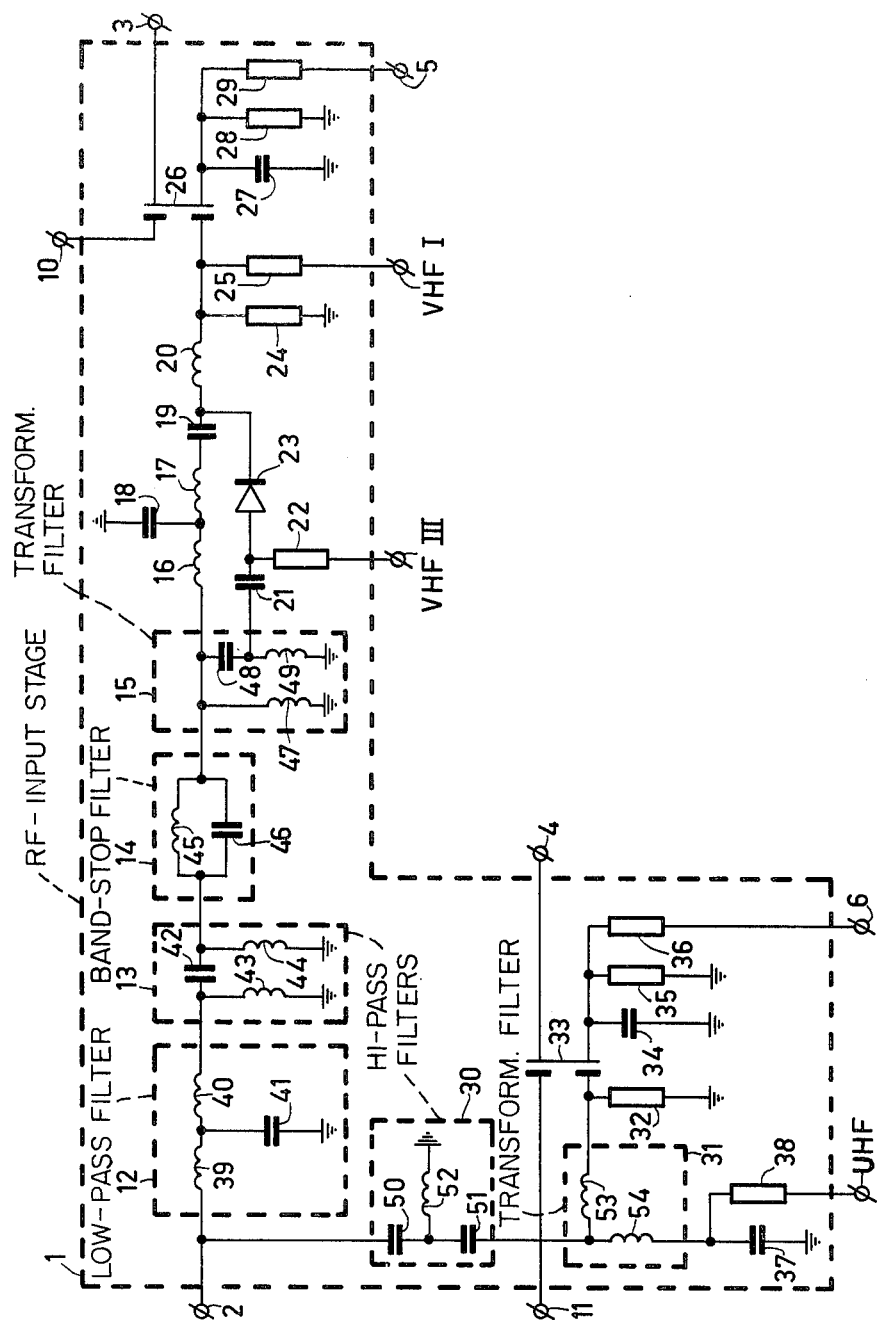

RF-INPUT STAGE

BACKGROUND OF THE INVENTION

The invention relates to an RF-input stage comprising a field effect transistor in a grounded source circuit configuration, the gate electrode of which is connected to an aerial input via a frequency-dependent coupling network and to ground via a resistor. Such a stage may be used in T.V.-receivers.

Such an RF-input stage is disclosed in U.S. Pat. No. 3,482,167.

The frequency-dependent coupling network of the prior art RF-input stage has inter alia for its function to realize an impedance transformation between the low impedance (approximately 75Ω) aerial input and the high impedance (approximately 3kΩ) input of the field effect transistor. Such a transformation of the impedance can only be realized in a satisfactory way for a comparatively narrow frequency range, for example to the order of 2 to 3 TV-channels. In order to enable signal processing of the TV-channel within at least one TV frequency band the known, comparatively narrow-band filter element is of a tunable construction. The frequency-dependent coupling network then also serves to provide a given channel selection.

In order to somewhat equalize the bandpass characteristic, the frequency-dependent coupling network is loaded with the resistance. At small resistance values, the signal loss through the resistor may become particularly large, so that the signal-to-noise ratio of the RF-input stage decreases. Therefore, in actual practice this resistance is selected rather high in value, generally higher than the input impedance of the field effect transistor.

As the prior art coupling network realizes a comparatively large impedance transformation, it may happen that noise signals at the aerial input result in an impermissible large cross-modulation, even at a very small noise amplitude.

In addition, the tuning of the frequency-dependent coupling network must be accurately locked to the tuning of the local oscillator of the TV receiver in which the known RF-input stage is used. Consequently, it is rather costly to realize the known RF-input stage.

SUMMARY OF THE INVENTION

It is an object of the invention to provide an RF-input stage of the type defined in the preamble, which, on the one hand, can be realized with low cost and by means of which, on the other hand, improved properties, inter alia as respect cross-modulation, may be obtained than with the prior art RF-input stage.

According to the invention, such an RF-input stage is characterized in that the resistor has a value at which, on the one hand, the frequency-dependent coupling network is terminated with an acceptable reflection factor when the RF-input stage is connected to an aerial signal source and, on the other hand, this resistor forms, in conjunction with the output impedance of the frequency dependent coupling network, an impedance which is at least substantially equal to the source impedance at which the noise contribution of the field effect transistor is at its minimum, which frequency-dependent coupling network comprises a bandpass filter having a bandwidth which comprises at least one standardized TV-frequency band.

The invention makes use of the fact that the optimum source impedance for noise of a field effect transistor, that is to say that signal source impedance at which the noise contribution of a field effect transistor is at its minimum, has a value which is a few times smaller than the input impedance of the field effect transistor. From U.S. Pat. No. 3,518,565 it is known that in that event, an optimum, reflection-free aerial connection of the RF-input stage as well as an optimum impedance matching for noise of the field effect transistor can be obtained by a proper dimensioning of said resistance.

The invention is based on the recognition of the fact that at said dimensioning of the resistance and the coupling network, the loss in signal-to-noise ratio is indeed larger compared to that of the known RF-input stage due to the smaller resistance but that the noise contribution of the field effect transistor itself is now significantly less than in the known case.

When the measure in accordance with the invention is used, the total noise contribution of the RF-input stage is at most equally large as in the prior art RF-input stage, while the value of said resistor and the impedance transformation of the coupling network are considerably less.

This results in the following advantages:

Firstly, the bandpass filter of the frequency-dependent coupling network may be a simple wide-band filter, so that it is not necessary to tune it when used for TV-frequencies within a TV-frequency band.

Secondly, the voltage gain of the coupling network is smaller than in the prior art case, so that the sensitivity to noise signals which may, for example, produce cross-modulation, decreases. In this respect it should be noted that an RF-input stage in accordance with the invention is preferably characterized in that the reflection factor is not more than ½, the value of the resistance being larger than the absolute value of the output impedance of the frequency-dependent coupling network.

Thirdly, the comparatively low resistance equalizes the pass characteristic of the bandpass filter to a large extent, so that the signal amplitude and consequently the quality of TV signals within the pass frequency band can be kept constant in a simple way within acceptable limits. A preferred embodiment of an RF-input stage in accordance with the invention is therefore characterized in that the bandpass characteristic of the frequency-dependent coupling network has an attenuation variation of not more than 3 dB over the frequency range of at least a standardized TV frequency band.

DESCRIPTION OF THE DRAWING

The invention will now be further described by way of non-limitative example with reference to the accompanying drawing.

DESCRIPTION OF THE PREFERRED EMBODIMENT

The sole FIGURE of this drawing shows an RF-input stage in accordance with the invention, comprising field effect transistors (FET) 26 and 33 of the MOST-tetrode type, the respective first gate electrodes of which are connected to an aerial input 2 via frequency-dependent coupling networks 12-23 and 30,31 and also to ground via resistors 24, 25 which are parallel resistors for high frequency and 32, respectively. The respective second gate electrodes of the FET's 26 and 33 are coupled to control inputs 10 and 11 for applying an automatic gain control signal to the RF-input stage 1.

The drain electrodes of these FET's 26 and 33 are connected to the outputs 3 and 4, respectively, of the RF-input stage and the source electrodes are connected to ground for high frequency via capacitors 27 and 34, respectively. Said source electrodes are also connected to supply terminals 5 and 6 via voltage dividers 28, 29 and 35, 36, respectively, for the application of a source operating voltage.

The frequency-dependent coupling network 12-23 comprises a VHF-bandpass filter 12-14 for selecting TV-signals within a frequency band of approximately 45 to 300 MHz (VHFI and VHFIII) and suppressing TV signals located at a frequency corresponding to the normal TV intermediate frequency (38.9 MHz). To that end, the VHF bandpass filter 12-14 comprises a cascade arrangement of a low-pass T-filter 12 connected to the aerial input 2 and having a cut-off frequency of 300 MHz, a high-pass filter 13 having a cut-off frequency at 45 MHz and an IF band-stop filter or trap 14 having a resonant frequency at 38.9 MHz. The low-pass T filter 12 comprises two equal coils 39 and 40 provided in the series branch and a capacitor 41 in a shunt branch which is connected to ground. The high-pass filter 13 comprises a capacitor 42 provided in a series branch and coils 43 and 44 provided in shunt branches which are connected to ground. The IF-trap filter 14 comprises a parallel LC-network 45, 46.

The VHF band-pass filter 12-14 is connected to the first gate electrode of the FET 26 via a transformation filter 15-23 which can be switched between VHFI(4-7-68 MHz) and VHFIII (174-272 MHz).

The transformation filter 15-23 comprises a coupling element 15 which comprises a coil 47, which is connected between the IF-trap filter 14 and ground, and a series LC-network 48-49 arranged in parallel therewith. The common connection between the coil 47, the IF-trap filter 14 and the capacitor 48 of said series LC-network 48, 49 is connected via a T-network 16-18 and a series arrangement of a coupling capacitor 19 and a coil 20 to the gate electrode of the FET 26 as well as to the common junction of the resistors 24 and 25.

The T-network 16-18 comprises two coils 16 and 17 provided in a series branch and a capacitor 18 provided in a shunt branch which is connected to ground. The common junction between the capacitor 48 and the coil 49 of the series LC-network 48, 49 of the coupling element 15 is connected to the common junction of the coupling capacitor 19 and the coil 20 via a coupling capacitor 21 and a switching diode 23 which is connected in the pass direction. The anode of the switching diode 23 is connected to a switching terminal VHF III through a resistor 22.

The resistors 24 and 25, which are connected in parallel to ground for high frequency, form, in conjunction with the input impedance of the FET 26, a terminating impedance for the frequency-dependent coupling network 12-23. The parallel value of these resistors 24 and 25 has been selected such that, on the one hand, a termination which is reflection-free within acceptable limits, of the frequency-dependent coupling network 12-23 is obtained. The voltage standing-wave ratio (V.S.W.R.) may then be, for example, 3. On the other hand, the parallel value of resistors 24 and 25 in combination with the output impedance of the frequency-dependent coupling network must be at least substantially equal to the optimum source impedance of the FET 26, that is to say the impedance at which the noise contribution of the FET 26 is minimal. This results, at least to as far as the gate electrode of the FET 26, in a substantially reflection-free impedance matching at a low overall noise contribution of the RF-input stage. As is known, the reflection at said standing wave ratio amounts to $\frac{1}{2}$, i.e. the amplitude of the reflected signal is half the amplitude of the forward signal. Such a reflection is obtained when the value of the resistor is three times as large as the absolute value of the output impedance of the frequency-dependent coupling network 12-23. In actual practice, the value of the resistor 24 is: 1.3 k$\Omega$ and the value of the resistor 25: 3.9 k$\Omega$. The parallel value of resistors 24 and 25 is consequently approximately 1 K$\Omega$, i.e. approximately 3× the absolute value of the output impedance of the coupling network 12-23. The input of the FET 26 then "sees" a source impedance of approximately 250$\Omega$, causing its noise contribution to be very low. Although because of the impedance ratio of the low parallel value of the resistors 24, 25 and the high input impedance of the FET 26, only a small portion of the applied signal power is applied to the FET 26, the effects of the signal reflections resulting from this power mismatch may be ignored because of the rather short connection as regards the wavelength between the junction of the resistors 24 and 25 and the gate-source semiconductor junction of the FET 26.

On tuning to a TV-channel in the standardized VHFI frequency range (47-68 MHz) a positive voltage is applied to the switching terminal VHFI. This causes, on the one hand, the gate electrode of the FET 26 to be brought to a positive operating voltage via the resistors 24, 25 which function as a voltage-divider, and, on the other hand, the switching diode 23 is rendered non-conductive via the coil 20. The VHFI-signals are then passed from the aerial input 2 to the gate electrode of the FET 26 via the VHF-bandpass filter 12-14, the coupling element 15 and the elements 16-20.

For the signal frequencies in the VHFI range the coil 49 is substantially a short circuit, so that the coupling element 15 forms, in this frequency range, a parallel LC-network 47, 48 which is connected to ground. The resonant frequency of this parallel LC-network 47, 48 is approximately 100 MHz. The coupling element 15 indeed acts somewhat as a filter but in conjunction with the coil 16 and the capacitor 18 of the T-network 16-18 this coupling element functions predominantly as an impedance transformation network. With the impedance transformation effected therein, the signal impedance at the output of the IF-trap filter 14, which is substantially equal to the aerial impedance, is transformed towards the output of the frequency-dependent coupling network 12-23 to approximately $\frac{1}{3}$ of the parallel value of the resistors 24 and 25.

The VHFI selection from the VHF frequencies from 47-300 MHz at the output of the VHF bandpass filter 12-14 is mainly carried out by means of the capacitor 18 and the coil 17 of the T-network 16-18.

On tuning to a TV-channel in the standardized VHFIII-frequency range (174-272 MHz) a positive switching voltage is applied to the switching terminal VHFIII, whereby the switching diode 23 is rendered conductive so that the gate electrode of the FET 26 is brought to an operating voltage via the resistors 22 and 24 which function as a voltage-divider, and the switching diode 23. The VHFIII signals are then passed from the aerial input 2 to the gate electrode of the FET-26 via the VHF bandpass filter 12-14, the coupling element 15 and the elements 20, 22 and 23.

For the VHFIII-signal frequencies the T-network 17-18 shows a high input impedance while the coupling element 15 functions as a high-pass filter for this frequency range. Apart from this selective action, the coupling filter 15, or more specifically the coil 49 thereof, accomplishes in conjunction with the coil 20 an impedance transformation, the signal impedance of the VHFIII signals at the output of the IF trap filter 14 being transformed for this VHFIII frequency range towards the output of the frequency-dependent coupling network 12-23 to at least approximately ⅓ of the parallel value of the resistors 24 and 25.

The frequency-dependent coupling network 30, 31 which, as mentioned in the foregoing, connects the aerial input 2 to the gate electrode of the FET 33, includes a frequency-dependent coupling network 30, 31 comprised of a high-pass T-filter 30 having a cut-off frequency at approximately 450 MHz and a transformation filter 31 arranged in cascade therewith and connected to the gate electrode of the FET 33.

Two equal capacitors 50 and 51 are provided in a series branch of the high-pass T-filter 30, a coil 52 being provided in the shunt branch which is connected to ground. The transformation filter 31 comprises a coil 54 connected between the high-pass T-filter 30 and a grounded capacitor 37, and a coil 53 connected between the high-pass T-filter 30 and the gate electrode of the FET 33. The gate electrode of the FET 33 is connected to ground via a resistor 32, while the common junction between the coil 54 and the ground capacitor 37 is connected to a switching terminal UHF via a resistor 38. In conjunction with the input impedance of the FET 33 the resistor 32 forms a terminating or load impedance of the frequency-dependent coupling network 30, 31.

On tuning to a TV-channel in the standardized UHF-frequency range (470–854 MHz) a positive switching voltage is applied to the switching terminal UHF, as a result of which the gate electrode of the FET 33 is brought to an operating voltage via the resistors 38 and 32 which function as a voltage-divider. In the high-pass T-filter 30 the UHF-signals are selected from the aerial signals applied to the aerial input 2. By means of the transformation filter 31 the signal impedance is transformed to approximately ⅓ of the value of the resistor 32. This results in an at least acceptable reflection-free termination of the frequency-dependent coupling network 30, 31. The standing-wave ratio is then 3. The resistor 32 is chosen approximately equal to four times the optimum noise impedance of the FET 33. The FET 33 then "sees" approximately the optimum source impedance so that its noise contribution is particularly low.

In a practical embodiment of the circuit the FET's 26 and 33 are MOSFET-tetrodes of the type BF 910 and the switching diode 23 is of the type BA 182. The elements employed have the following values:

| coil no. | wire thickness (mm) | core thickness (mm) | turns | capacitor no. | valve (nF) | resistor no. | value Ω |
|---|---|---|---|---|---|---|---|
| 39 | 0,5 | 3 | 3½ | 41 | 12 | 22 | 3K3 |
| 40 | 0,5 | 3 | 3½ | 42 | 39 | 24 | 1K3 |
| 43 | 0,5 | 3 | 14½ | 46 | 82 | 25 | 3K9 |
| 44 | 0,5 | 3 | 9½ | 48 | 18 | 28 | 240 |
| 45 | 0,5 | 3 | 14½ | 18 | 27 | 29 | 1K2 |
| 47 | 0,5 | 3 | 8½ | 19 | 1K | 32 | 1K |
| 49 | 0,5 | 3 | 2½ | 21 | 4K7 | 35 | 240 |
| 16 | 0,5 | 3 | 6½ | 27 | 820 | 36 | 1K8 |

-continued

| coil no. | wire thickness (mm) | core thickness (mm) | turns | capacitor no. | valve (nF) | resistor no. | value Ω |
|---|---|---|---|---|---|---|---|
| 17 | 0,5 | 4 | 18½ | 50 | 4P7 | 38 | 3K3 |
| 20 | 0,5 | 3 | 4½ | 51 | 4P7 | | |
| 52 | 0,5 | 3 | 1½ | 37 | 100P | | |
| 53 | 0,5 | 2½ | 1½ | 34 | 390 | | |
| 54 | 0,5 | 2½ | 1½ | | | | |

A 12 V switching and supply voltage is employed. For the setting of the operating voltage at the gate electrode of the FET 26 in the VHFIII mode, the voltage drop across the switching diode 23 is also taken into consideration. Owing to the capacitive character of the input impedance of the FET's 26 and 33, the load thereof on the respective frequency-depending coupling networks 12-23 and 30, 31 is not negligibly low. The parallel value of the resistors 24, 25 and the input impedance of the FET 26 is approximately 1000Ω, while the parallel value of the resistor 32 and the input impedance of the FET 33 is approximately 780Ω.

It will be obvious that the invention is also applicable for different frequency-band distributions and that it is not limited to TV-signals.

It is alternatively possible to observe a different requirement with respect to the standing-wave ratio and to apply the invention thereto. If a reflection coefficient equal to zero is required (V.S.W.R.=1) then the coupling networks 12-23 and 30, 31 must be terminated with a resistance value which is on the one hand equal to the absolute values of the output impedances of these coupling networks and on the other hand at least approximately twice the optimum noise-source-signal impedance of the field effect transistors 26 and 33, respectively. In the construction shown, this requirement results in a resistance value for the parallel arrangement of the resistors 24, 25 and for the resistor 32 of approximately 500Ω. Although this results in an optimum power match there occurs, however, a greater loss in the signal-to-noise ratio through said resistors.

If, in contrast therewith, a greater reflection is allowed, for example a reflection of 67% (V.S.W.R.=5) then a resistance value of 1.5 kΩ may be chosen for the parallel arrangement of the resistors (24, 25) and for the resistor 32 in the embodiment shown. The noise contribution of the overall RF-input stage is then considerably less than in the cases described in the foregoing.

What is claimed is:

1. An RF input stage for TV receivers, comprising a field effect transistor in grounded source circuit configuration, the gate electrode of which is connected to an aerial input via a frequency-dependent coupling network and to ground via a resistor, characterized in that the resistor has a value at which, on the one hand, the frequency dependent coupling network is terminated with a limited reflection factor when the aerial input of the RF input stage responds to an incoming signal and, on the other hand, the resistor forms, in conjunction with the output impedance of the frequency-dependent coupling network, an impedance which is substantially equal to a signal source impedance for said field effect transistor at which the noise contribution of the field effect transistor is at its minimum, which frequency-dependent coupling network comprises a bandpass filter having a bandwidth which comprises at least one standardized TV-frequency band.

2. An RF-input stage as claimed in claim 1, characterized in that the reflection factor is not more than ½, the value of the resistor being larger than the absolute value of the output impedance of the frequency-dependent coupling network.

3. An RF-input stage as claimed in claim 1 or 2, characterized in that the frequency-dependent coupling network realizes an impedance transformation of not more than five.

4. An RF-input stage as claimed in claim 1 or 2, characterized in that the bandpass characteristic of the frequency-dependent coupling network has an attenuation variation of not more than 3 dB over the frequency range of at least a standardized TV-frequency band.

5. A RF-input stage as claimed in claim 1 or 2, characterized in that the frequency-dependent coupling network comprises a transformation filter arranged in cascade with the bandpass filter for predominantly transforming the input impedance of the RF-input stage to substantially the parallel value of said resistor and the input impedance of the field effect transistor.

6. A RF-input stage as claimed in claim 5, characterized in that the bandpass filter has a bandpass frequency range which comprises at least two standardized TV-frequency bands, said transformation filter comprising a switchable filter element for conducting the TV-signals of one of the said TV-frequency bands in a switchable mode to the field effect transistor.

7. A RF-input stage as claimed in claim 1 or 2, characterized in that the RF-input stage comprises a further frequency-dependent coupling network having a pass frequency band which comprises a further standardized TV frequency band, said frequency-dependent coupling network being connected to the gate electrode of a further field effect transistor, and a changeover circuit for interchangeably applying an operating voltage to the gate electrodes of said two field effect transistors.

8. A RF-input stage as claimed in claim 6, characterized in that the RF-input stage comprises a further frequency-dependent coupling network having a pass frequency band which comprises a further standardized TV frequency band, said frequency-dependent coupling network being connected to the gate electrode of a further field effect transistor, and a change-over circuit for interchangeably applying an operating voltage to the gate electrodes of the said two field effect transistors.

* * * * *